United States Patent [19]
Tseng et al.

[11] Patent Number: 5,830,772
[45] Date of Patent: Nov. 3, 1998

[54] METHOD FOR FABRICATING ISOLATING REGIONS FOR BURIED CONDUCTORS

[75] Inventors: Che-Pin Tseng, Hsinchu; Nai-Jen Yeh; Yu-Chih Chuang, both of Hsinchu Hsien; Cheng-Chih Kung, Miaoli, all of Taiwan

[73] Assignee: United MicroelectronicsCorp., Hinsnchu, Taiwan

[21] Appl. No.: 526,073

[22] Filed: Sep. 8, 1995

[51] Int. Cl.⁶ .......................... H01L 21/44; H01L 21/76; H01L 21/8246
[52] U.S. Cl. .................................. 437/44; 437/49; 437/48
[58] Field of Search .................................. 437/44, 43, 49, 437/52, 74, 48; 257/399, 400, 408

[56] References Cited

U.S. PATENT DOCUMENTS

| | | |
|---|---|---|
| 4,574,465 | 3/1986 | Rao . |
| 4,922,816 | 5/1990 | Ino . |
| 4,977,079 | 12/1990 | Kotaki . |
| 5,158,902 | 10/1992 | Hanada . |
| 5,334,543 | 8/1994 | Lin et al. . |
| 5,418,176 | 5/1995 | Yang et al. . |
| 5,427,966 | 6/1995 | Komorz . |
| 5,449,634 | 9/1995 | Inoue . |
| 5,475,036 | 12/1995 | Hong . |
| 5,514,611 | 5/1996 | Kim et al. . |

*Primary Examiner*—George Fourson
*Attorney, Agent, or Firm*—Fish & Richardson, P.C.

[57] ABSTRACT

Although the spacers are formed on the sidewalls of gate electrode and words lines via the same steps of deposition and etch-back processes, only the spacers disposed at the sidewalls of the gate electrode are practical for fabricating peripheral devices with LDD structure, and such fabrication is impractical in the memory cell region. On the contrary, the region beneath the spacers disposed at the sidewalls of word lines will become the path through which leakage current flows. The present invention makes use a shielding layer to cover the second active region as a masking, and then removes the spacers disposed at the sidewalls of word lines. Afterwards, isolating regions are formed through one implantation procedure to thereby decrease leakage current and simplify the process flow.

9 Claims, 6 Drawing Sheets

METHOD FOR FABRICATING ISOLATING REGIONS FOR BURIED CONDUCTORS

BACKGROUND OF THE INVENTION

1. Field of the Invention

The present invention generally relates to the fabrication technique of memory devices, and, in particular, relates to a method for fabricating isolating regions for buried conductors.

2. Technical Background

Read-only memory semiconductor devices, herein referred to as ROM devices, have been widely utilized in various types of digital equipment, ranging from minicomputer systems to microprocessor-based personal computer systems. ROM's are utilized to store programs or codes that are not to be altered under normal use conditions for these systems. The production of these ROM devices is normally designated by a customer, who supplies the code, or program, to be stored in the ROM device. In other words, the memory content of a particular ROM for a particular application is "programmed" at the factory which produces the ROM device.

The fabrication of a ROM IC is a relatively complicated process. Many of the fabrication steps take considerable time and involve special processing of the utilized material as well as requiring strict control of the processing environment. When manufacturing ROM IC devices of the same model, the fabrication procedural steps are generally the same, the only difference between specific devices being in the memory content to be programmed. The programming of the ROM memory content in the fabrication process of a ROM IC device is at the final stage of the entire process. Therefore, it is possible to manufacture a large quantity of a particular ROM IC device up to the stage of programming storage content, and then temporarily store such fabricated devices until the designation of the memory content. In this way, the production of code-containing ROM IC's may appear to a customer to be a fast process. A manufacturer has only to prepare the corresponding code-masks for the particular program content and execute the programming procedure. Generally, the actual process of programming a ROM IC device to contain a designated code content involves implanting impurities of selected conductance type into selected memory cell transistors of the ROM IC. The selection of the memory cell transistor to be subjected to the ion implantation procedure corresponds to the code content when the ROM IC device is read accessed. The implanting of the impurities in the memory cells determines the read result of either an ON-state or an OFF-state of the memory cell transistor. The state of impurity implantation decides the ON-state or the OFF-state.

Conventionally, ROM devices use buried conductor structures as bit lines, the top view of which is depicted in FIG. 1. The fabrication of ROM device is suited to a semiconductor substrate 1, such as a P-type silicon substrate, provided with a field oxide layer 100 serving as isolation structure to separate substrate 1 into a first active region 110 and a second active region 120. The first active region 110 is a memory cell region, the core circuit of a ROM device, and the second active region 120 is a region for fabricating peripheral circuits, such as read/write circuits, a sense amplifier, or other transistor devices.

Next, through a photolithography procedure, a photoresist layer (not shown in the drawing) is formed on the surface for defining the patterns of buried bit lines. Then, when an ion implantation procedure is applied to substrate 1, buried bit lines 10 are formed and spaced apart in parallel fashion. As exemplified, the implanted impurities can utilize arsenic ions ($AS^+$) with a dosage of about 1E15–8E15 $cm^{-2}$ at an energy of about 70–100 KeV. After removing the photoresist layer, thermal oxidation of the surface of substrate 1 forms a dielectric layer 11 covering thereon. Subsequently, a polysilicon layer is deposited on dielectric layer 11, being etched and patterned into a plurality of word lines 12 within first active region 110 as well as a gate electrode 14 within second active region 120, by means of photolithography and etching processes. These word lines 12 are formed along a direction nearly perpendicular to those buried bit lines 10. Therefore, the substrate 1, below each word line 12 and between two neighboring bit lines 10, constitutes a channel region of a MOS device. The neighboring two buried bit lines 10 act as source/drain regions under the control of word lines 12 striding over the channel region therebetween. Then, a layer made of silicon nitrides or silicon oxides is formed to cover the overall surface, and afterwards an etch-back procedure is applied to form sidewall spacers 16 and 17 on the sidewalls of word lines 12 and gate electrode 14, respectively. The formation of spacers 17 is utilized to constitute peripheral devices with LDD (lightly-doped drain) structure within second active region 120.

Usually, to eliminate leakage current among these buried bit lines 10, another ion implantation procedure will be performed. If the buried bit lines 10 are of N-type conductivity, P-type impurities are implanted into substrate 1 not covered by word lines 12 as well as beneath the opposite sides of the buried bit lines 10 as isolating regions. Referring to FIG. 2A–2C, a conventional process flow of fabricating isolating regions for buried bit lines is illustrated, wherein FIG. 2A is a cross-sectional view of FIG. 1 cut along a line A–A'. As mentioned above, substrate 1 is provided with isolation structure 100 to demarcate substrate 1 into first active region 110 and second active region 120. Word lines 120 and gate electrode 14 are disposed in first and second active regions 110 and 120, respectively. Moreover, sidewall spacers 16 and 17 are disposed on the sidewalls of word lines 12 and gate electrode 14, respectively, when formed in the same etch-back procedure. Moreover, dielectric layer 11 is placed among gate electrode 14, word lines 12 and substrate 1.

For the purpose of decreasing leakage current, as shown in FIG. 2B, a photoresist layer 200 is formed by photolithography to cover second active region 120. Then, as shown in FIG. 2C, impurities 20, of an opposite conductivity type to that of buried lines 10, are implanted into substrate 1 to form isolating regions 22 through photoresist layer 200, which is used as masking. If the conductivity type of buried bit line 10 is N-type, the implanted impurities will have a conductivity type of P-type, such as $B^+$ or $BF_2^+$ ions. Owing to the shielding of spacers 16 formed on the sidewalls of word lines 12, the substrate 1 beneath spacers 16 is not included in isolating regions 22, and therefore suffers from the leakage current between neighboring two buried bit lines 10 via the region under spacers 16.

Consequently, U.S. Pat. No. 5,334,543 disclosed another method for insulating buried conductors, the process flow of which is depicted in FIGS. 3A–3E. As depicted in FIG. 3A, prior to the formation of spacers 16 an 17, a photoresist layer 300 is formed to cover second active region 120. With photoresist layer 300 used as masking, impurities 30 are implanted into substrate 1, the region beneath the opposite sides of word lines 12, to form first isolating regions 32. If the conductivity type of buried bit lines 10 is N-type, the implanted impurities will utilize P-type ions, such as $B^+$ and BF2+. The resulting drawing is shown in FIG. 3B. Then, photoresist layer 300 is removed.

Next, referring to FIG. 3C, spacers 16 and 17 are formed on the sidewalls of word lines 12 and gate electrode 14, respectively. Moreover, as shown in FIG. 3D, another photoresist layer 310 is formed to cover second active region 120, and then impurities 34 are implanted into substrate 1 to form second isolating regions 36 in junction with first isolating regions 32 with photoresist layer 310 and accompanying spacers 16 used as masking. The conductivity of implanted impurities 34 is P-type ions, such as $B^+$ or $BF2^+$, while the conductivity type of buried bit lines 10 is N-type. Then, second isolating regions 36 are formed through two implantation procedures with the same conductivity type impurities, thus the doping concentration of second isolating regions 36 is higher than that of first isolating regions 32.

However, according to '543, prior to the formation of spacers, an impurities implantation must be performed, and yet another implantation must be carried out after spacers are formed on the sidewalls of gate electrode and word lines. Such two implantation procedures require extra photolithography procedures and therefore make the process more complicated than desirable.

SUMMARY OF THE INVENTION

Therefore, it is an object of the present invention to provide a method of fabricating insulating regions for buried conductors which utilizes only one implantation procedure to form isolating regions in order to decrease the leakage current therebetween.

For attaining the object mentioned above, a method for fabricating a semiconductor device is provided, which comprises:

(a) providing a semiconductor substrate having an isolation structure thereon for separating the substrate into a first active region and a second active region;

(b) forming a plurality of first conductors spaced apart in the substrate within the first active region;

(c) forming a dielectric layer overlying the substrate;

(d) forming a plurality of second conductors spaced apart and a gate electrode on the dielectric layer within the first and second active regions, respectively;

(e) forming sidewall spacers on sidewalls of the second conductors and the gate electrode;

(f) removing the sidewall spacers disposed on the second conductors; and (g) implanting impurities into the substrate not covered by the conductors to form isolating regions between neighboring pairs of the first conductors.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DETAILED DESCRIPTION OF ONE PREFERRED EMBODIMENT

Figure 1:
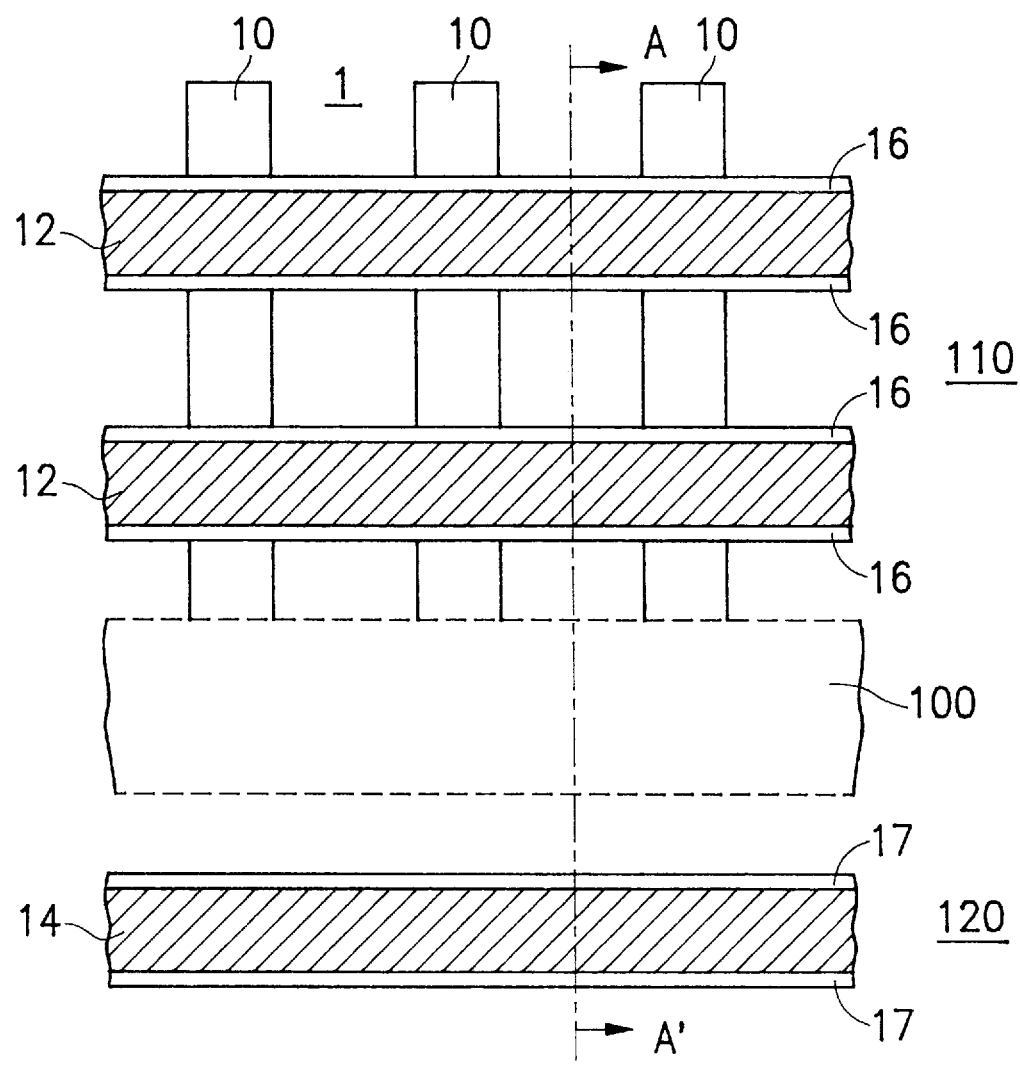
FIG. 1 depicts the top view of a read only memory device.
Figure 2A:
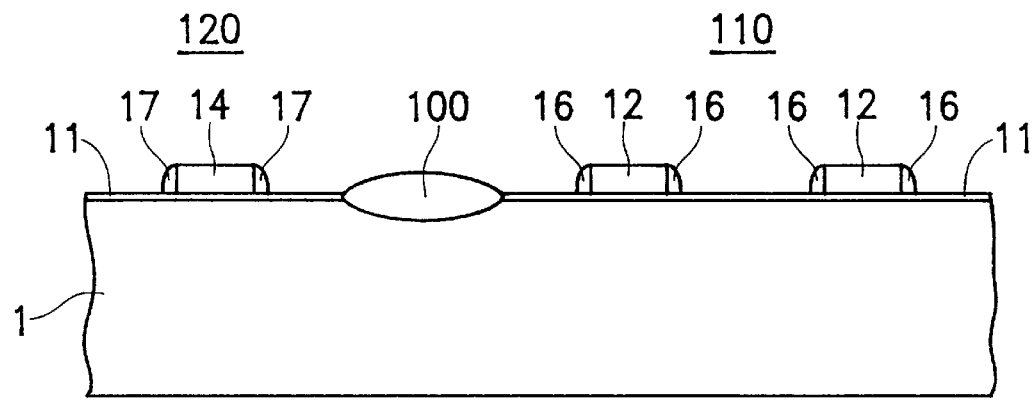
FIGS. 2A–2C depict the process flow, in cross-sectional views, of a conventional method of fabricating isolating regions for buried conductors.
Figure 2B:
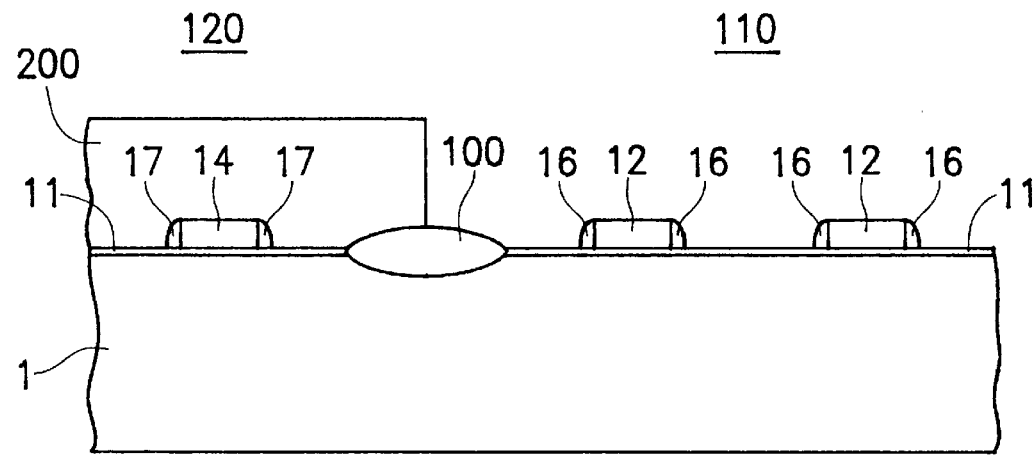
Figure 2C:
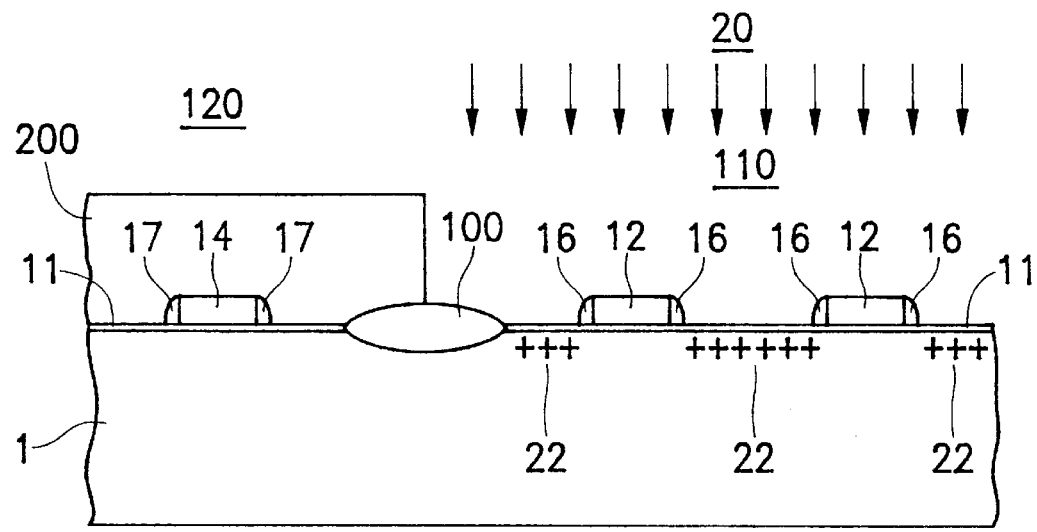
Figure 3A:
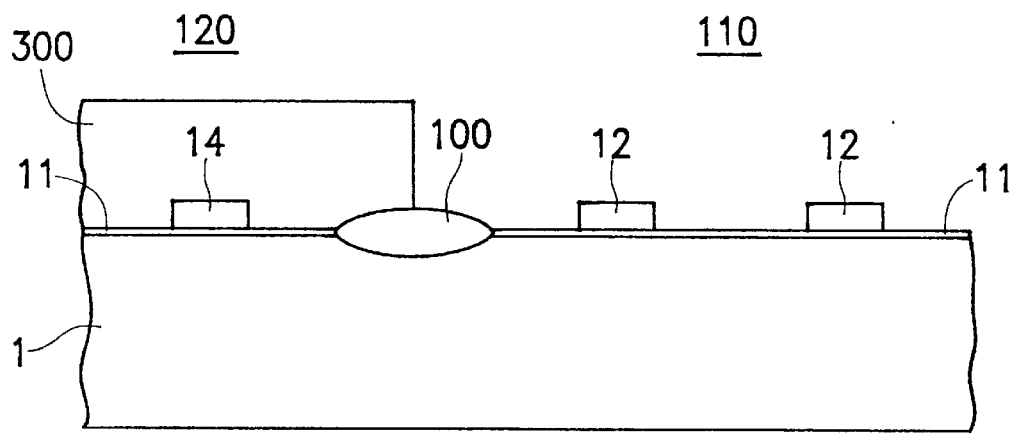
FIGS. 3A–3E depict the process flow, in cross-sectional views, of another conventional method of fabricating isolating regions for buried conductors.
Figure 3B:
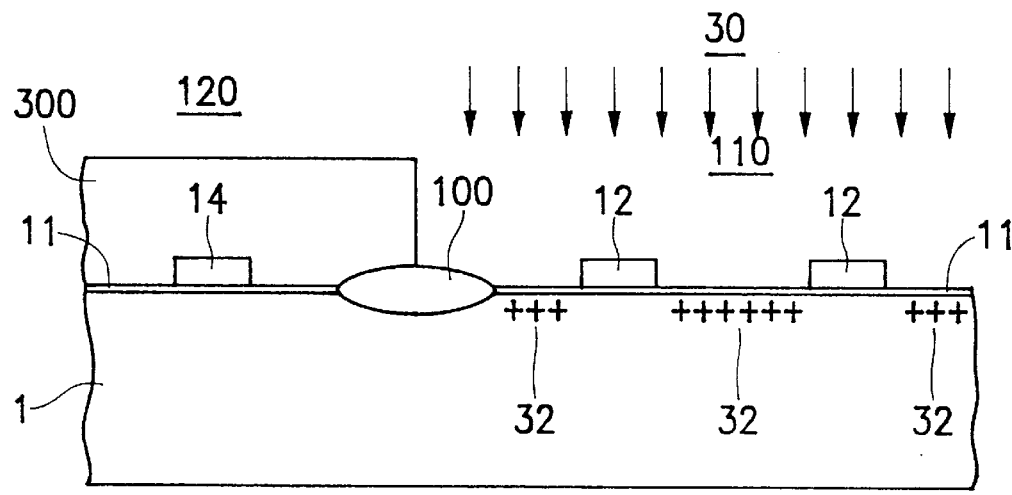
Figure 3C:
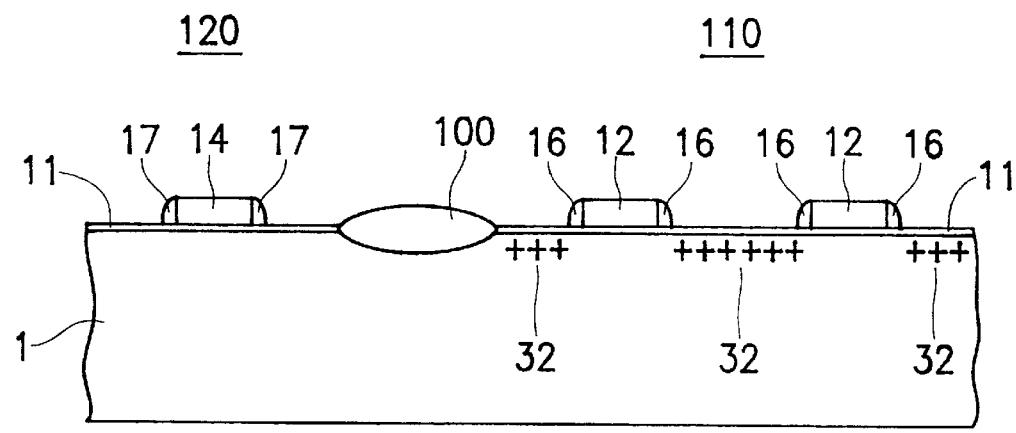
Figure 3D:
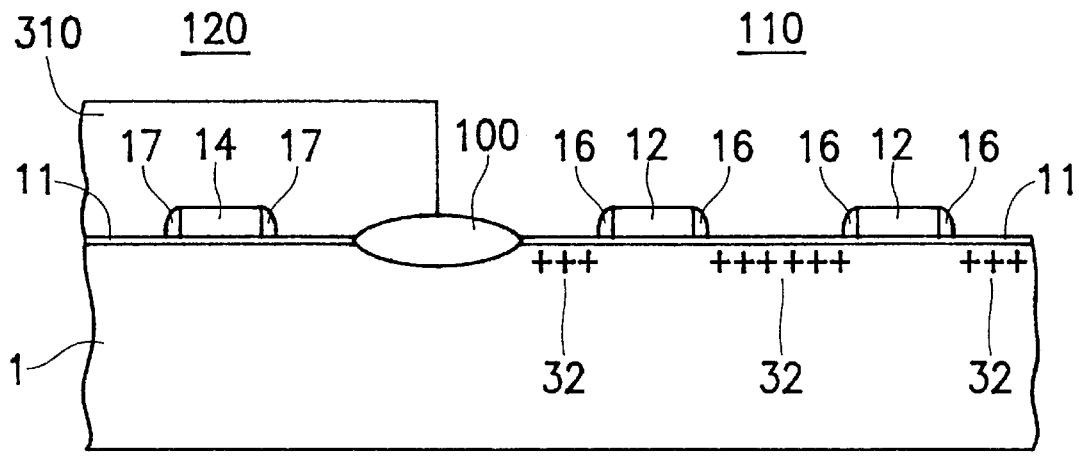
Figure 3E:
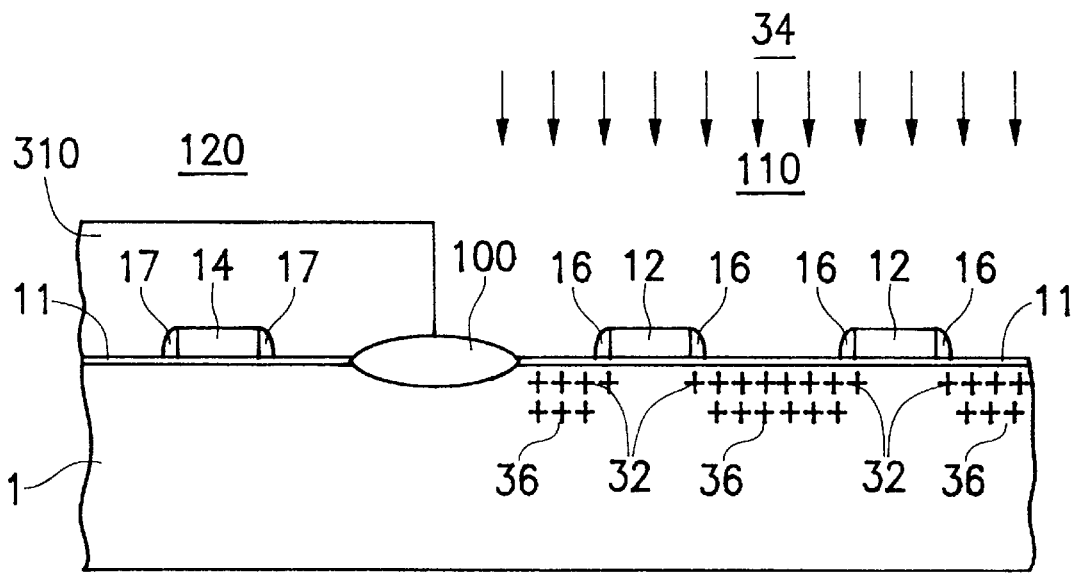
Figure 4A:
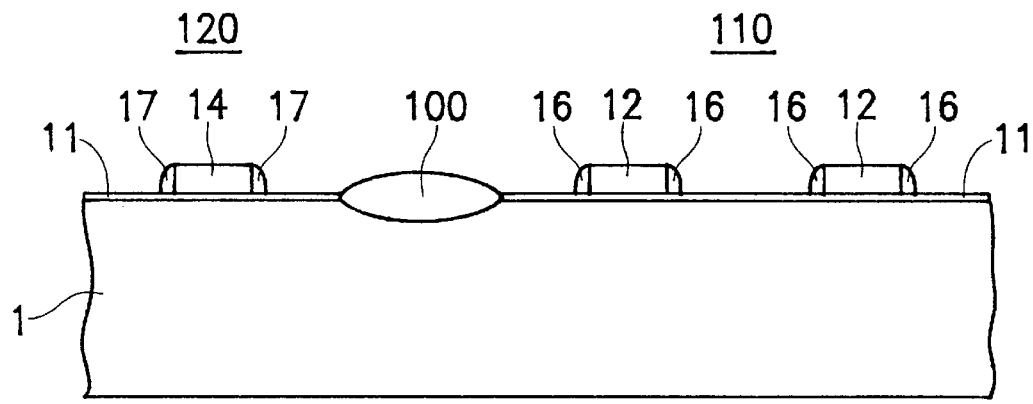
FIGS. 4A–4D depicts the process flow, in cross-sectional views, of one preferred embodiment in accordance with the present invention.

Referring to FIGS. 4A–4D, the process flow of one preferred embodiment in accordance with the present invention is depicted in cross-sectional views, wherein FIG. 4A is a cross-sectional view of FIG. 1 cut along a line A–A'. Numeral 1 is a semiconductor substrate, such as a P-type silicon substrate. Numeral 100 designates field oxides formed by the LOCOS (Local Oxidation of Silicon) method serving as an isolation structure, so as to demarcate a first active region 110 as memory cell region in the right hand side and a second active region 120 as peripheral region in the left hand side. Numeral 11 designates a dielectric layer formed by thermal oxidation. Respectively, a plurality of word lines 12 and gate electrode 14 are formed on substrate 1 within first active region 110 and second active region 120. Spacers 16 and 17 are formed on the sidewalls of word lines 12 and gate electrode 17, respectively, but the formation of spacers 16 and 17 is processed via the subsequent steps consisting of deposition and etching back procedures. Note that spacers are made of material, such as silicon nitrides, which etches selectively relative to silicon oxides.

Figure 4B:
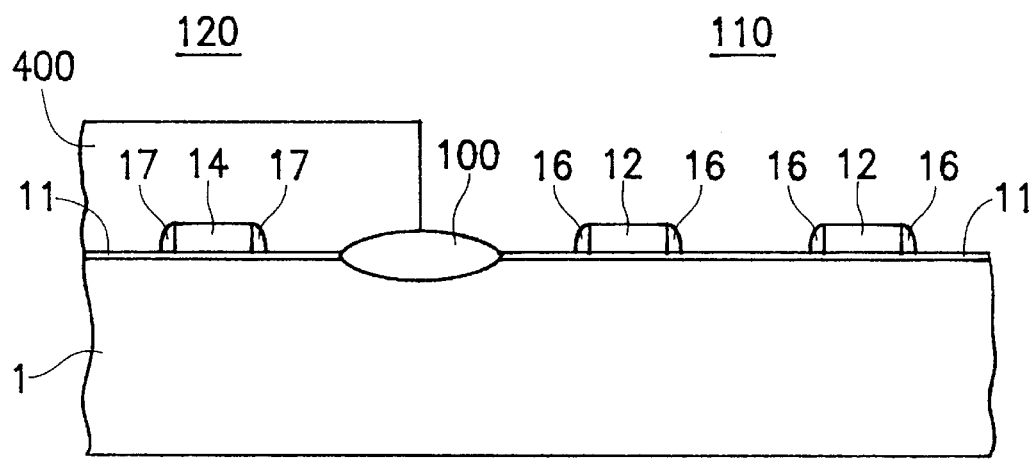
Figure 4C:
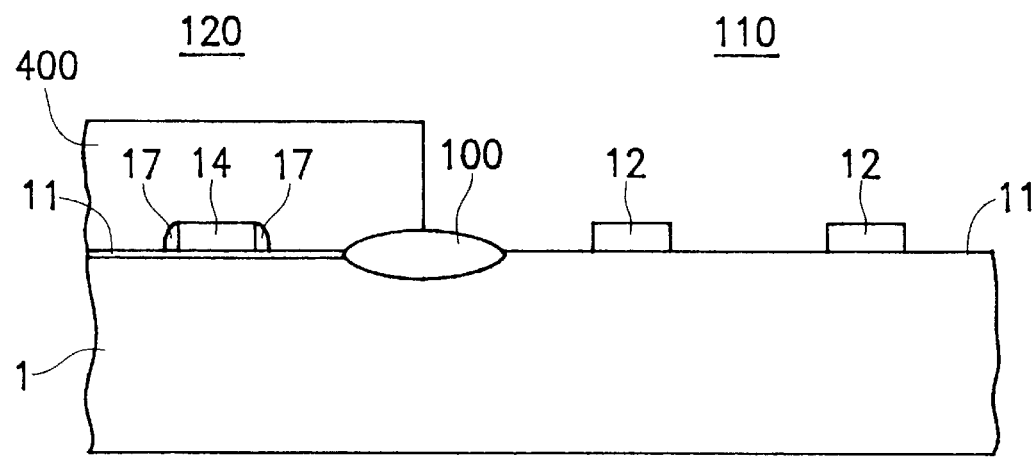

Then, as depicted in FIG. 4B, a shielding layer 400, such as a photoresist layer defined through photolithography process, is formed to cover second active region 120, including gate electrode 14 and spacer 17 thereon. With shielding layer 400 used as masking, spacers 16 on the sidewalls of word lines 12 are removed by etching, resulting in the cross-sectional view depicted in FIG. 4C. Such removal procedure is performed by selectivity etching spacers 16 to dielectric layer 11. For example, if dielectric layer 11 is made of silicon oxides, spacers 16 might be made of silicon nitrides. Owing to the good etching selectivity of silicon nitrides relative to silicon oxides, dielectric layer 11 still remains on substrate 1 after spacers 16 are removed.

Figure 4D:
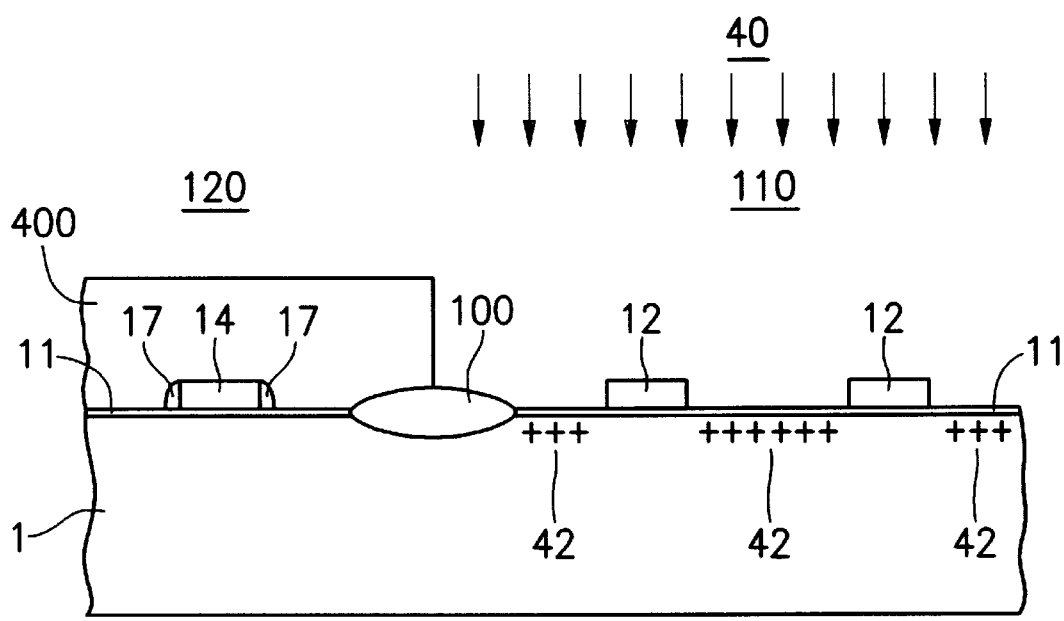

Finally, as shown in FIG. 4D, using the same photoresist layer 400 as masking, impurities 40 are implanted into substrate 1, the region beneath the opposite sides of word lines 12, so as to form isolation regions 42. If the conductivity type of buried lines 10 is N-type, the conductivity type of implanted impurities 42 is P-type, such as $B^+$ or $BF_2^+$ ions at a dosage of about 1E12–5E13 $cm^{-2}$ with an energy of about 50–100 KeV. Accordingly, the formation of isolation regions 42 can decrease the leakage current between buried bits lines 10.

In conclusion, though the spacers are formed on the sidewalls of gate electrode and words lines respectively via the same steps of deposition and etch-back processes, only the spacers disposed at the sidewalls of the gate electrode are practical for fabricating peripheral devices with LDD structure, the fabrication is not feasible in memory cell region. On the contrary, the region beneath the spacers disposed at the sidewalls of word lines will become the path through which leakage current flows. The present invention makes use of a shielding layer to cover the second active region as a masking, and then removes the spacers disposed at the sidewalls of word lines. Afterwards, isolating regions are formed through one implantation procedure to thereby decrease leakage current and simplify the process flow.

While this invention has been described in terms of the above specific embodiments, those skilled in the art will recognize that the invention can be practiced with modifications within the spirit and scope of the appended claims, i.e. that changes can be made in form and detail, without departing from the spirit and scope of the invention. Accordingly, all such changes that come within the purview of the invention encompass the subject matter of the claims which follow.

What is claimed is:

1. A method for fabricating a semiconductor device, comprising:
   (a) providing a semiconductor substrate having an isolation structure thereon to separate said substrate into a first active region and a second active region;
   (b) forming a plurality of first conductors spaced apart in said substrate within said first active region;
   (c) forming a dielectric layer overlying said substrate;
   (d) forming a plurality of second conductors spaced apart and a gate electrode on said dielectric layer within said first and second active regions, respectively, each second conductor overlying at least two of the first conductors;
   (e) forming sidewall spacers on the sidewalls of said second conductors and said gate electrode;
   (f) removing said sidewall spacers disposed on said second conductors; and
   (g) implanting impurities into said substrate not covered by said conductors to form isolating regions between neighboring pairs of said first conductors.

2. The method as in claim 1, between step (e) and (f), further comprising:
   forming a shielding layer covering said second active region.

3. The method as in claim 2, wherein said shielding layer is a photoresist layer formed by a photolithography procedure.

4. The method as in claim 1, wherein the step (g) is performed by $BF_2^+$ ions with a dosage of about 1E12–5E13 $cm^{-2}$ at an energy of about 50–100 KeV.

5. The method as in claim 1, between the steps (d) and (e), further comprising:
   depositing a silicon nitride layer overlying the overall surface;
   etching back said silicon nitride layer.

6. The method as in claim 1, wherein said dielectric layer is a silicon oxide layer formed by thermal oxidation.

7. The method as in claim 1, said isolation structure is made of silicon oxides formed through a local oxidation of silicon (LOCOS) process.

8. The method as in claim 1, wherein said first conductors are heavily-doped regions formed by implanting impurities into said substrate.

9. The method as in claim 1, wherein said second conductors are made of polysilicon.

* * * * *